(12) United States Patent
Morey-Chaisemartin

(10) Patent No.: US 7,157,289 B2
(45) Date of Patent: Jan. 2, 2007

(54) METHOD FOR HOMOGENIZING THE THICKNESS OF A COATING ON A PATTERNED LAYER

(75) Inventor: Philippe Morey-Chaisemartin, Le Bourgeat (FR)

(73) Assignee: Xyalis, Grenoble (FR)

( * ) Notice: Subject to any disclaimer, the term of this patent is extended or adjusted under 35 U.S.C. 154(b) by 146 days.

(21) Appl. No.: 10/631,582

(22) Filed: Jul. 31, 2003

(65) Prior Publication Data
US 2004/0069744 A1 Apr. 15, 2004

(30) Foreign Application Priority Data
Jul. 31, 2002 (FR) ................... 02 09764

(51) Int. Cl.
*H01L 21/00* (2006.01)
(52) U.S. Cl. .................... 438/5; 438/14; 438/926
(58) Field of Classification Search ............ 438/5, 438/14, 926
See application file for complete search history.

(56) References Cited

U.S. PATENT DOCUMENTS

| | | | |
|---|---|---|---|
| 5,923,563 A | 7/1999 | Lavin et al. | |
| 6,054,362 A | 4/2000 | Chuang | |
| 6,253,362 B1 | 6/2001 | Anand et al. | |
| 6,396,158 B1 * | 5/2002 | Travis et al. | 257/784 |

FOREIGN PATENT DOCUMENTS
GB 2 364 598 A 1/2002

OTHER PUBLICATIONS

Yoo-Hyon Kim, et al., CHAMPS (CHemicAl-Mechanical Planarization Simulator), 2000 International Conference on Simulation Semiconductor Processes and Devices, Seattle, WA, (Cat No. 00TH8502), XP002240847, Sep. 6-8, 2000, pp. 123-126, Piscataway, NJ, USA, IEEE.

* cited by examiner

*Primary Examiner*—Anita Alanko
(74) *Attorney, Agent, or Firm*—Lowrie, Lando & Anastasi, LLP

(57) ABSTRACT

A method for homogenizing the thickness of a uniform layer deposited on a layer of a material etched according to functional patterns, consisting of filling the empty areas with dummy patterns; a function, providing the thickness variation of the uniform layer for a given distribution of the functional and dummy patterns, being known; the method comprising:
  determining a guard distance greater than the minimum possible distance between patterns;
  calculating the thickness variation which would be obtained if dummy patterns were placed inside of a region defined by the dimension of the empty area reduced by said guard distance; and
  if the calculated thickness variation is satisfactory, adopting the chosen dummy pattern distribution, otherwise iteratively repeating the process with a reduced guard distance.

4 Claims, 2 Drawing Sheets

METHOD FOR HOMOGENIZING THE THICKNESS OF A COATING ON A PATTERNED LAYER

BACKGROUND OF THE INVENTION

1. Field of the Invention

The present invention relates to a method for homogenizing the thickness of a uniform layer deposited on a layer of a material etched according to functional patterns so that there exist areas where this material is densely present and empty areas.

The present invention more specifically applies to the manufacturing of multiple metallization levels on integrated circuits and will be described in this context. It should however be understood that it may apply to other fields in which a layer with a planar upper surface is desired to be deposited on an uneven underlying layer.

2. Discussion of the Related Art

FIG. 1 shows a substrate 1, for example, a silicon substrate on which a number of metallization levels and of insulating layers have already been deposited, and comprising on its upper surface an insulating layer 2 on which is formed a conductive layer, for example metallic, in which are defined metallization patterns 3. Some of these patterns are connected by vias not shown to underlying metallizations. These metallization patterns, mainly intended to ensure connections or form elements of passive components, will be called functional patterns hereafter. Once the metal layer has been deposited and etched, a new insulating layer 4, currently silicon oxide, on which a next metallization level will be desired to be deposited, is deposited.

Due to the unevenness of the functional patterns formed in metal layer 3, layer 4 will have an uneven upper surface. Various methods are known in the art to level this layer, one of the currently most commonly-used methods being a physico-chemical etch. However, when the unevenness of metallization patterns 3 is too strong, even after a planarization step, the upper surface of insulating layer 4 cannot become perfectly planar, which is a significant disadvantage for the implementation of the next steps of resist deposition, masking, and photolithography. There then further exists a risk of alteration of the functional patterns.

To overcome this disadvantage, it has been provided, before depositing insulating layer 4, to etch conductive layer 3, on the one hand, as desired to form the desired functional patterns, and on the other hand, to insert dummy patterns 6 therein. The positions of these dummy or filling patterns must be stored in the memory of definition of the etch mask of conductive layer 3.

According to a first conventional method, such as illustrated in FIG. 2A in cross-section view and in FIG. 2B in top view, as soon as the distance between two functional patterns leaves room to insert an elementary pattern, generally of square shape, compatible with the dimension and spacing rules (design rules) set by the involved photolithography technique, at least one dummy pattern is inserted between two functional patterns. In FIG. 2A, dummy patterns 6 are hatched. It can be understood that, once such a filling is over, the upper insulating layer 4 which will be deposited will be relatively planar and may become perfectly planar after physico-chemical polishing. Thus, in the most current fashion, this filling is performed systematically, each filling square having the minimum dimensions compatible with the design rules of the considered integrated circuit and the distance between two added elementary patterns also corresponding to the minimum spacing compatible with the design rules of the considered integrated circuit.

This method, based on the design rules, has the advantage of being simple, whereby the positions of the dummy patterns are rapidly calculated. It however has disadvantages, that is, not all inserted elementary dummy patterns are necessary to the leveling. These patterns could actually be a little less numerous or a little more spaced apart. This means that useless patterns have been inserted, which results in an increase in the dimension of the memory used to form the mask comprising the functional patterns and the dummy patterns. Another disadvantage is that these added dummy patterns have undesirable parasitic effects, especially by the creation of lateral stray capacitances between the dummy patterns of a level and the functional patterns of the same level and of vertical stray capacitances between the dummy patterns of a level and the functional or dummy patterns of the adjacent conductive levels.

To avoid part of these disadvantages, it is known to use a model, that is, a function providing the thickness variation $e(x,y)$ of layer 4 according to density $D(x,y)$ of the metallization patterns. Thus, once the drawing of the functional mask of layer 3 has been made, curve D of the density versus the pattern position is drawn, as shown in FIG. 3 (this curve is shown in a single dimension for simplicity but it should be understood that it is in fact drawn in a bidimensional model). This curve is smoothed, for example, by successively calculating the discrete Fourier transform (DCT(D)) and the inverse discrete Fourier transform of the density curve.

Integrated circuit manufacturers generally know, at least experimentally, the function providing the thickness variation according to the density curve. This curve is designated with reference $e(x,y)$ in FIG. 4. If a thickness variation $\Delta e$ is acceptable on the final curve, it should be understood that it is sufficient to insert dummy patterns at the locations represented by hatchings and designated by reference 7 in FIG. 4. Dummy patterns 6 are then inserted in these sole areas 7. Further, a number of excess dummy patterns may be suppressed.

This approach enables reducing the number of dummy elements and thus reducing the number of points to be stored in the mask, although this reduction is only apparent since, given that the pattern positions are not regular, their memorization is more complex. A reduction in stray capacitances is also obtained, but the dummy elements still risk being close to a functional element, of same level or of a higher or lower level, and this problem is not solved.

SUMMARY OF THE INVENTION

Thus, an object of the present invention is to provide a method of filling with dummy elements a conductive level where there exist unevenly-distributed functional elements, this method enabling reduction of the stray capacitances with the elements of the same level, according to a first aspect of the present invention, and also with elements of another level, according to a second aspect of the present invention.

To achieve this object, the present invention provides a method for homogenizing the thickness of a uniform layer deposited on a layer of a material etched according to functional patterns so that there exist areas where this material is densely present and empty areas, consisting of filling the empty areas with dummy patterns of predetermined dimensions, in which a function is known, enabling calculation, for a given distribution of the functional patterns and of the dummy patterns, of which the thickness variation of the homogeneous layer will be. The method comprises, for each empty area, the steps of determining a guard distance greater than the minimum possible distance between patterns; calculating the thickness variation which would be obtained if dummy patterns were placed inside of a region defined by the dimension of the empty area reduced by said guard distance; and if the calculated thickness variation is satisfactory, adopting the chosen dummy pattern distribution, otherwise iteratively repeating the process with a reduced guard distance.

According to an embodiment of the present invention, the empty areas are defined taking into account the level of the considered material and the projection of patterns of the material to a higher and/or lower level.

According to an embodiment of the present invention, the placing of the dummy patterns is performed by using predetermined spacing rules corresponding to photolithography techniques used to form the functional patterns.

According to an embodiment of the present invention, the placing of the dummy patterns is performed by using an optimization calculation based on the thickness distribution function.

The foregoing objects, features, and advantages of the present invention will be discussed in detail in the following non-limiting description of specific embodiments in connection with the accompanying drawings.

DETAILED DESCRIPTION

Figure 5A:
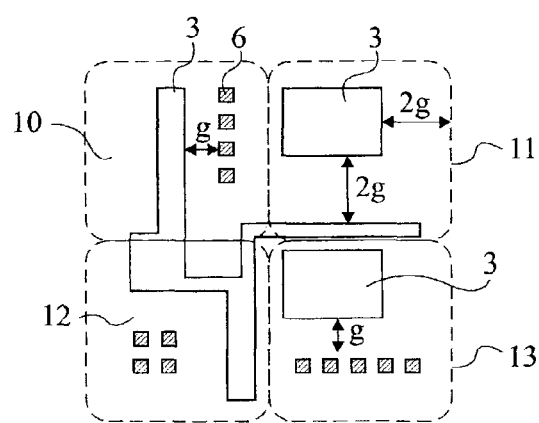
FIGS. 5A and 5B show two successive steps of a first implementation mode of the method according to the present invention.

FIG. 5A shows a top view of an example of an integrated circuit portion in which are present functional regions 3 of a metallization level 3. The surface of this portion is divided into windows 10, 11, 12, 13.

According to the present invention, a guard distance g between a dummy pattern and a functional pattern is defined, guard distance g being much greater than the predetermined minimum distance (design rule minimum) between elementary patterns in the considered technology for metallization level 3. Each window is then filled with a maximum number of dummy elements 6 such that their distance to the window limits and to the functional elements contained in this window is greater than or equal to guard distance g. It can be seen that this results in placing a vertical row of dummy patterns in window 10, a square of dummy patterns in window 12, a horizontal row of dummy patterns in window 13, and no dummy pattern in window 11 since, in window 11, the distances between functional elements or between a functional element and an opposite window limit are no greater than 2 g.

Figure 1:
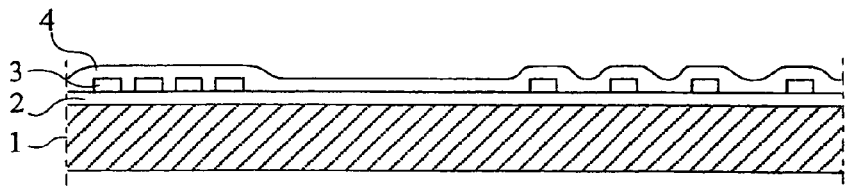
FIG. 1 illustrates the problem that the present invention aims at solving.
Figure 2A:
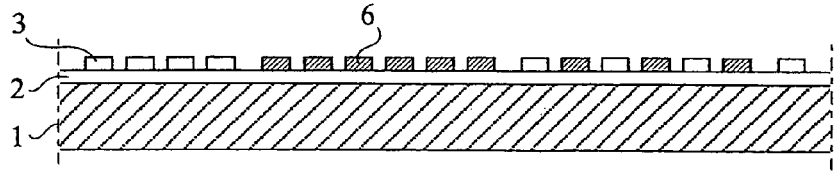
FIG. 2A shows in cross-section and FIG. 2B in top view an example of a solution according to the state of the art to the problem to solve.
Figure 2B:
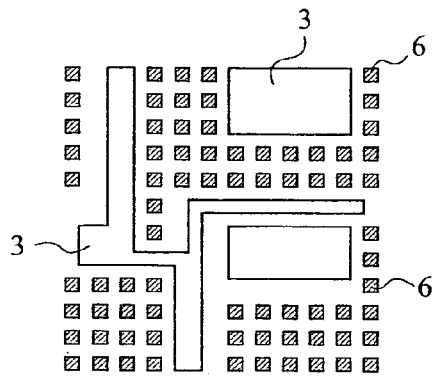
Figure 3:
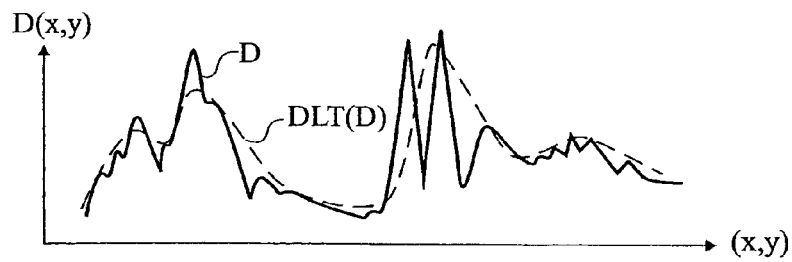
FIG. 3 shows a pattern density variation curve.
Figure 4:
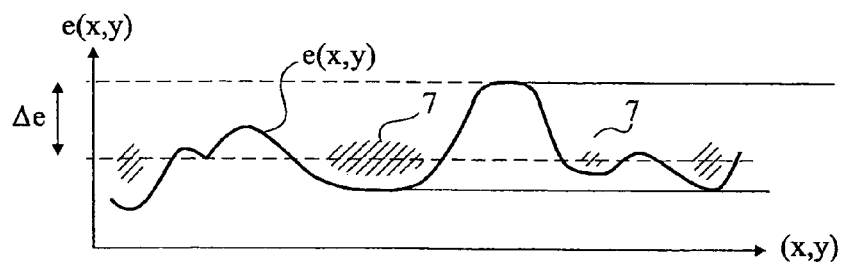
FIG. 4 shows a layer thickness variation curve.

Once this first filling has been determined, the thickness variation which would be obtained in layer 4 if the dummy patterns shown in FIG. 5A were inserted is calculated by the method explained in relation with FIGS. 3 and 4.

If this thickness variation calculation provides a satisfactory value, the process is stopped here.

If, however, the calculation shows for example that the thickness variation is satisfactory in windows 10 and 12, but is excessive in windows 11 and 13, then a new guard distance g' smaller than g is defined for windows 11 and 13 and a new filling is performed. This leads to performing, for example, the elbow filling illustrated in window 11 and to performing a three-row filling in window 13. It should be understood that this is an example only and that it could have been passed in window 13 from a filling with one centered row to a filling with two centered rows. Indeed, for the time being, no hardware element has been formed, and only calculations simulating the elements to be stored in a mask memory have been performed.

Figure 5B:
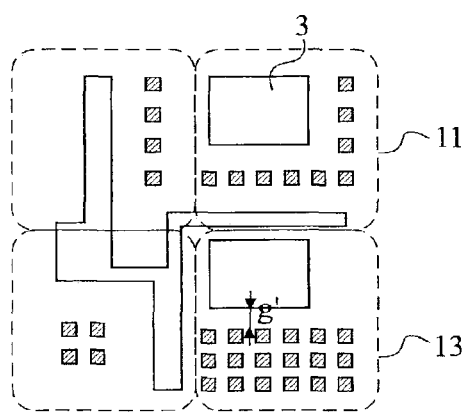

Once this second filling has been determined, the thickness variation which would be obtained in layer 4 if the patterns shown in FIG. 5B were inserted therein and the guard distance modification process is repeated or not according to the obtained result.

Figure 6A:
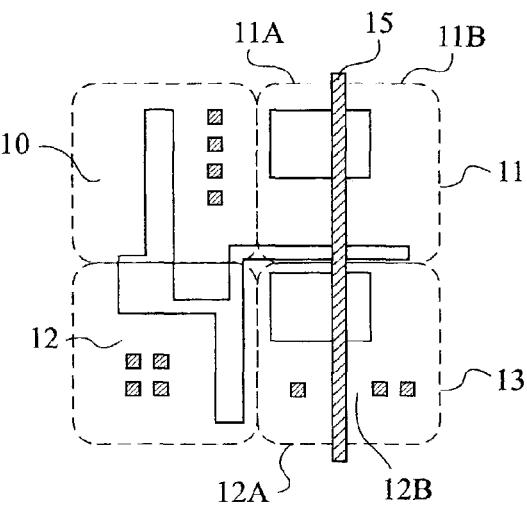
FIGS. 6A and 6B show two successive steps of a second implementation mode of the method according to the present invention.

A significant advantage of the present invention is that it enables taking into account adjacent levels. This is illustrated in relation with FIGS. 6A and 6B. In FIG. 6A, the same elements as in FIG. 5A plus one hatched column 15 which corresponds to a metallization line formed on a level higher or lower than the considered level have been shown. To reduce stray capacitances, it is desired to avoid for dummy elements to be placed opposite to this column.

Figure 6B:
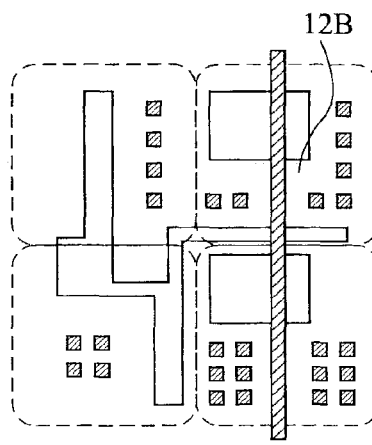

Then, each of windows 11 and 13 is treated as if it were divided in two sub-windows 11A–11B and 13A–13B on either side of line 15. The filling of each sub-window is then performed in several steps, as illustrated in FIGS. 6A and 6B. A calculation and verification step is performed between the steps illustrated in FIGS. 6A and 6B.

An advantage of the previously-described method is that it is particularly simple and that, within a window, the inserted dummy elements are regularly distributed, which enables providing grouped memorization elements enabling saving memory space.

Instead of performing a systematic filling with dummy elements having the standard size and spacing provided by the design rules of the considered technology, preliminary or subsequent studies may be performed to optimize the distribution of the dummy elements within each window and in the entire circuit to further reduce the number of these dummy elements. The maximum spacing or step between dummy elements may for example be chosen to remain at an acceptable thickness variation threshold Δe.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for homogenizing the thickness of a uniform layer deposited on a layer of a material etched according to functional patterns so that there exist areas where the material is densely present and empty areas, consisting of filling the empty areas with dummy patterns of predetermined dimensions; a thickness distribution function, providing the thickness variation ($e(x,y)$) of the uniform layer for a given distribution ($D(x,y)$) of the functional patterns and the dummy patterns, being known; said method comprising, for each empty area, the steps of:
- (a) determining a guard distance (g) between a functional pattern and a dummy pattern greater than the minimum possible distance between the functional patterns;
- (b) calculating the thickness variation which would be obtained if the dummy patterns were placed inside of a region defined by the dimension of the empty area reduced by said determined guard distance;
- (c) determining whether the thickness variation calculated in step (b) is satisfactory;
- (d) adopting the chosen dummy pattern distribution upon a determination in step (c) that the thickness variation calculated in step (b) is satisfactory; and
- (e) iteratively repeating steps (b) and (c) with a reduced guard distance (g') for at least one empty area in which it is determined in step (c) that the thickness variation calculated in step (b) is not satisfactory.

2. The method of claim 1, wherein the empty areas are defined taking into account the level of the considered material and the projection of patterns of the material of a higher and/or lower level.

3. The method of claim 1, wherein the placing of the dummy patterns is performed using spacing rules corresponding to photolithography techniques used to form the functional patterns.

4. The method of claim 1, wherein the placing of the dummy patterns is based on the thickness distribution function.

* * * * *